United States Patent
Lee et al.

(10) Patent No.: US 7,018,911 B2
(45) Date of Patent: Mar. 28, 2006

(54) METHODS FOR FABRICATION FOR PHASE-CHANGEABLE MEMORY DEVICES HAVING PHASE-CHANGEABLE MATERIAL REGIONS WITH LATERAL CONTACTS

(75) Inventors: Se-Ho Lee, Gyeonggi-do (KR); Young-Nam Hwang, Seoul (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/940,141

(22) Filed: Sep. 14, 2004

(65) Prior Publication Data

US 2005/0030832 A1    Feb. 10, 2005

Related U.S. Application Data

(62) Division of application No. 10/647,700, filed on Aug. 25, 2003, now Pat. No. 6,806,528.

(30) Foreign Application Priority Data

Sep. 3, 2002    (KR) ............................... 2002-52728

(51) Int. Cl.
*H01L 47/00* (2006.01)

(52) U.S. Cl. .................... 438/466; 257/296; 438/238; 438/618

(58) Field of Classification Search ................ 438/238, 438/466
See application file for complete search history.

(56) References Cited

U.S. PATENT DOCUMENTS

| | | | | |
|---|---|---|---|---|
| 5,920,788 A * | 7/1999 | Reinberg | ................... | 438/466 |
| 6,534,780 B1 | 3/2003 | Gonzalez et al. | | |
| 6,806,528 B1 * | 10/2004 | Lee et al. | ................... | 257/296 |
| 6,951,805 B1 * | 10/2005 | Moore | ................... | 438/618 |

* cited by examiner

*Primary Examiner*—David Nelms
*Assistant Examiner*—Dao H. Nguyen
(74) *Attorney, Agent, or Firm*—Myers Bigel Sibley & Sajovec PA

(57) ABSTRACT

A phase-changeable memory device comprises a substrate and an access transistor formed in and/or on the substrate. Laterally spaced apart first and second conductive patterns are disposed on the substrate and have opposing sidewalls. A conductor electrically connects the first conductive region to a source/drain region of the access transistor. A phase-changeable material region is disposed between the first and second conductive patterns and contacts the opposing sidewalls of the first and second conductive patterns. Contact areas between the conductive patterns and the phase-changeable material region are preferably substantially smaller than contact areas at which the conductive patterns contact conductors (e.g., vias) connected thereto, such that high current densities may be developed in the phase-changeable material. Methods of fabricating such devices are also discussed.

17 Claims, 12 Drawing Sheets

METHODS FOR FABRICATION FOR PHASE-CHANGEABLE MEMORY DEVICES HAVING PHASE-CHANGEABLE MATERIAL REGIONS WITH LATERAL CONTACTS

RELATED APPLICATIONS

The present application is a divisional of U.S. application Ser. No. 10/647,700 filed on Aug. 25, 2003 now U.S. Pat. No. 6,806,528, entitled Phase-Changeable Memory Devices Having Phase-Changeable Material Regions with Lateral Contacts and Methods of Fabrication Therefor, and claims priority from Korean Patent Application No. 2002-52728 filed on Sep. 3, 2002 in the Korean Intellectual Property Office, the disclosures of which are incorprated herein in their entirety by reference.

FIELD OF THE INVENTION

The present invention relates to semiconductor memory devices and methods of fabrication therefor, and more particularly, to phase-changeable memory devices and methods of fabrication therefor.

BACKGROUND OF THE INVENTION

Semiconductor memory devices can be categorized as either volatile memory devices or nonvolatile memory devices according to whether or not data is retained when power supplies are interrupted. The volatile memory devices may be classified into a dynamic random access memory (DRAM) and a static random access memory (SRAM). The nonvolatile memory devices include flash memory devices. These memory devices represent a logic value, such as "0" or "1," based on stored charge. Because a periodic refresh operation is typically needed for such devices, a DRAM may require a high charge storage capacitance. Consequently, there have been attempts to increase a surface area of a capacitor electrode to increase storage capacitance. However, an increase in the surface area of the capacitor electrode can interfere with an increase in integration of the DRAM.

A typical flash memory device has gate patterns including a gate insulating layer, a floating gate, a dielectric layer, and a control gate, which are sequentially stacked on a semiconductor substrate. To write and erase data, a method of tunneling charges through the gate insulating layer is used at a voltage that is higher than the normal power supply voltage. Accordingly, flash memory devices typically require a booster circuit in order to produce the voltage for erase and write operations.

As memory devices become highly integrated, many efforts have been underway to develop a new memory device having nonvolatile and random access characteristics, and a simple structure. Phase-changeable memory devices are one type of such memory devices. A typical phase-changeable memory device has a cell made of a phase-changeable material. Depending on a provided current density (i.e., Joule heating), the phase-changeable material can be electrically switched between amorphous and crystalline states and/or between variously resistive crystalline states.

FIG. 1 is a graph showing a method of programming and erasing a phase-changeable memory cell. Here, a horizontal axis represents time (T) an axis represents temperature (TMP: ° C.) applied to the phase-changeable material cell. The phase-changeable material is heated at a temperature that is higher than a melting temperature Tm during a relatively short first time T1. Next, the phase-changeable material is rapidly quenched. In this case, the phase-changeable material may be changed into the amorphous state (curve 1). During a second time T2 that is longer than the first time T1, the phase-changeable material is heated at a temperature that is lower than the melting temperature Tm and is higher than a crystallization temperature Tc. Next, the phase-changeable material is quenched. In this case, the phase-changeable material is changed into the crystalline state (curve 2). The resistivity of the phase-changeable material with the amorphous state is higher than that of the phase-changeable material with the crystalline state. Accordingly, currents flowing through the phase-changeable material may be detected in a read mode, and it is possible to discriminate whether information stored in the phase-changeable memory cell has a logic value of "1" or "0". Generally, a chalcogenide material is used as the phase-changeable material, in particular, a compound (hereinafter a "GST layer") including germanium (Ge), stibium (Sb), and tellurium (Te).

As described above, heat is typically needed in order to switch the state of the phase-changeable material. In the typical phase-changeable memory device, if currents of a high density flow through an area contacting the phase-changeable material, a crystallization state of the phase-changeable material at a contact area is varied. The smaller the contact area is, the lower the current density for changing the state of the phase-changeable material.

FIG. 2 is a cross-sectional view for explaining a typical phase-changeable memory device structure, which schematically shows a phase-changeable memory cell. Referring to FIG. 2, the typical phase-changeable memory device includes a lower conductive pattern 10, a phase-changeable material pattern 16 and an upper conductive pattern 18. The phase-changeable material pattern 16 is electrically connected to the lower conductive pattern 10 through a contact plug 14 formed in an insulating layer 12. The insulating layer 12 is disposed on the lower conductive pattern 10. The upper conductive pattern 18 is formed on the phase-changeable material pattern 16. In the typical phase-changeable memory device, if currents flow between the lower conductive pattern 10 and the upper conductive pattern 18, the crystallization state of the phase-changeable material varies in accordance with a pulse (i.e., heat) of the currents flowing through an area (hereinafter referred to as "active contact area") 20 where the contact plug 14 is in contact with the phase-changeable material pattern 16. The heat (i.e., energy) required to change the state of the phase-changeable material is directly affected by the active contact area 20 where the phase-changeable material pattern 16 is in contact with the contact plug 14. Preferably, the active contact area 20 should be made as small as possible.

However, because the lower conductive pattern 10 is connected to the phase-changeable material pattern 16 through the contact plug 14, a size of the active contact area 20 may be limited by a photolithography resolution for the contact hole, i.e., the size of the active contact area 20 generally cannot be reduced beyond the photolithography resolution. Furthermore, it may be difficult to form such contact holes uniformly in the memory device, which can result in variance in current flow for changing the state of the phase-changeable material for each contact area. Thus, mis-operation in read mode can easily occur. Also, because only one active contact area 20 is formed at the area that is in contact with the contact plug 14, a resistance variation resulting from the variation of the crystallization state is small.

SUMMARY OF THE INVENTION

According to some embodiments of the present invention, a phase-changeable memory device comprises a substrate and an access transistor formed in and/or on the substrate. Laterally spaced apart first and second conductive patterns are disposed on the substrate and have opposing sidewalls. A conductor electrically connects the first conductive region to a source/drain region of the access transistor. A phase-changeable material region is disposed between the first and second conductive patterns and contacts the opposing sidewalls of the first and second conductive patterns.

In some embodiments, the access transistor comprises first and second source/drain regions in the substrate and a gate electrode disposed on the substrate between the first and second source drain regions. The memory device further comprises an insulating layer disposed on the substrate and overlying the gate electrode and the first and second source/drain regions. The first and second conductive patterns are disposed on the insulating layer, and the conductor passes through the insulating layer and connects the first conductive pattern to the first source/drain region. The phase-changeable material layer is disposed on the insulating layer between the first and second conductive regions. The first and second conductive patterns may overlie respective ones of the first and second source/drain regions, and the phase-changeable material region may overlie the gate electrode.

According to further aspects, the conductor extends from the first source/drain region to contact the overlying first conductive pattern at a first contact area, and the first conductive pattern contacts the phase-changeable material region at a second contact area that is substantially smaller than the first contact area. The insulating layer may comprise a first insulating layer, the conductor may comprise a first conductor, and the memory device may further comprise a second insulating layer disposed on the substrate and overlying the first and second conductive patterns, and a second conductor passing through the second insulating layer and contacting the second conductive pattern at a third contact area. The second conductive pattern may contact the phase-changeable material region at a fourth contact area that is substantially smaller than the third contact area. For example, each of the first and second conductive patterns may comprise a body portion that contacts the corresponding one of the first and second conductors and a smaller tab portion that extends from the body portion to contact the phase-changeable material region.

A bit line conductor may be disposed on the second insulating layer, wherein the second conductor electrically connects the second conductive pattern to the bit line conductor. A common drain line conductor may be disposed in the first insulating layer between the second conductive pattern and the second source/drain region, and a third conductor may extend from the second source/drain region to contact the common drain line conductor.

According to further embodiments of the present invention, a phase-changeable memory device has active contact areas at opposite sidewalls of a phase-changeable material pattern. On the same plane as the phase-changeable material pattern, a pair of conductive patterns is disposed so as to be in contact with the active contact areas. Accordingly, a size of the active contact area depends on a thickness and a width of the conductive pattern. The thickness of the conductive patterns at the contact areas can be made smaller than the resolution of a photolithography resolution, so size of the active contact areas can be reduced in relation to conventional processes.

In accordance with further embodiments of the present invention, a phase-changeable memory device includes a pair of conductive patterns that are disposed on the same plane. The conductive patterns are spaced apart from each other. A variable resistivity material pattern is disposed between the conductive patterns so as to be in direct contact with the sidewalls of the conductive patterns at active contact areas. An upper metal interconnection for detecting resistivity of the variable resistivity material pattern is disposed over the conductive patterns and the variable resistivity material pattern so as to be electrically connected to one pattern of the conductive patterns. A semiconductor substrate having an impurity diffusion region is disposed under the conductive patterns and the variable resistivity material pattern so as to be electrically connected to another pattern of the conductive patterns. The variable resistivity material pattern is a phase-changeable material (e.g., a chalcogenide material) whose crystallization state is changed depending on applied heat (or energy).

Preferably, the upper metal interconnection is electrically connected to one conductive pattern through an upper contact plug. The upper contact plug penetrates an upper insulating layer disposed on the conductive patterns and the variable resistivity material pattern. Preferably, the impurity diffusion region is electrically connected to the other conductive pattern through a lower contact plug. The lower contact plug penetrates a lower insulating layer disposed under the conductive patterns and the variable resistivity material pattern.

In some embodiments, the phase-changeable memory device includes the other impurity diffusion region, a gate line, and a common drain electrode. The other impurity diffusion region is apart from the impurity diffusion region to which the lower contact plug is connected. The gate line is disposed on a semiconductor substrate between the impurity diffusion region and the other impurity diffusion region, and in the lower insulating layer. The common drain electrode is disposed in the lower insulating layer and is electrically connected to the other impurity diffusion region through a predetermined region of the lower insulating layer. When currents flow between the upper metal interconnection and the common drain electrode, a crystallization structure of a variable resistivity material at the active contact areas is changed in response to a density of the currents flowing across the active contact areas. For example, if predetermined currents are supplied in a state of grounding the upper metal interconnection and applying a turn-on voltage to the gate line, the heat (or energy) is applied to the active contact areas and, thus, the crystallization structure at the active contact areas is changed. By doing so, a program operation is performed. A read operation is performed by grounding the common drain electrode and applying a read voltage to the upper metal interconnection to detect resistance of the variable resistivity material pattern.

In some embodiments, the conductive patterns comprise titanium nitride. Each of the lower contact plug and the upper contact plug may respectively comprise titanium, titanium nitride and tungsten, which are sequentially stacked.

In accordance with further embodiments of the present invention, a phase-changeable memory device includes a phase-changeable material pattern, a pair of conductive patterns, an upper insulating layer, a bit line, a lower insulating layer, and a semiconductor substrate. The conductive patterns are disposed on the same plane as the phase-changeable material pattern and are in direct contact with the phase-changeable material pattern at active contact areas. The upper insulating layer is disposed on the phase-changeable material pattern and the conductive patterns. The bit line is disposed on the upper insulating layer and is electrically connected to one conductive pattern through an upper contact plug penetrating the upper insulating layer. The lower insulating layer is disposed under the phase-changeable material pattern and the conductive patterns. The semiconductor substrate includes a source region that is electrically connected to the other conductive pattern through a lower contact plug penetrating the lower insulating layer.

In some embodiments, the phase-changeable memory device includes a drain region, a gate line, and a common drain electrode. The drain region is apart from the source region to be formed in the semiconductor substrate. The gate line is disposed on a semiconductor substrate between the source and drain regions. The common drain electrode is disposed in the lower insulating layer and is electrically connected to the drain region through a predetermined region of the lower insulating layer.

In accordance with still other aspects of the present invention, a phase-changeable memory device includes a phase-changeable material pattern, a first electrode pattern, a second electrode pattern, resistance detection interconnection and a semiconductor substrate. The first electrode pattern is disposed on the same plane as the phase-changeable material pattern and is in contact with the phase-changeable material pattern at one active contact area. The second electrode pattern is disposed on the same plane as the phase-changeable material pattern and is in contact with the phase-changeable material pattern at another active contact area. Also, the second electrode pattern is formed symmetrically in mirror-image relations with respect to the first electrode pattern. The resistance detection interconnection is electrically connected to the first electrode pattern. The semiconductor substrate has an impurity diffusion region that is electrically connected to the second electrode pattern.

In some embodiments, an upper insulating layer is interposed between the phase-changeable material pattern and the resistance detection interconnection and between electrode patterns and the resistance detection interconnection. The resistance detection interconnection is electrically connected to the second electrode pattern through an upper contact plug penetrating the upper insulating layer. A lower insulating layer is interposed between the phase-changeable material pattern and the semiconductor substrate and between electrode patterns and the semiconductor substrate. The impurity diffusion region is electrically connected to the first electrode pattern through a lower contact plug penetrating the lower insulating layer. The resistance detection interconnection detects resistivity of the phase-changeable material pattern to provide information about a logic value.

In phase-changeable memory devices according to further embodiments of the present invention, each electrode pattern includes a plug contact region contacting a contact plug, and a material pattern contact region protruding from a middle portion of sidewalls of plug contact region toward the phase-changeable material pattern to contact the phase-changeable material pattern at an active contact area. A width of the material pattern contact region is preferably less than a thickness thereof. Accordingly, it is possible to reduce dimensions of the active contact areas.

According to further embodiments of the present invention, a memory device can be formed with an active contact area that is not defined by a contact plug process. The active contact area is formed at a side surface of a variable resistivity material pattern. Accordingly, a size of the active contact area is dependant upon a thickness of a conductive pattern contacting with the active contact area. The thickness of the conductive pattern can be thinner to decrease the size of the active contact area. According to further embodiments of the present invention, a memory device having two active contact areas can be provided. The active contact areas may be symmetrically formed at both sides of a variable resistivity material layer pattern.

In accordance with yet further embodiments of the present invention, there are provided methods of forming phase-changeable memory devices. A semiconductor substrate is formed with an impurity diffusion region. A conductive layer is formed that is electrically connected to the impurity diffusion region. Next, the conductive layer is patterned to form a symmetrical pair of conductive patterns so that one conductive pattern is electrically connected to the impurity diffusion region. A variable resistor pattern is then formed between the pair of conductive patterns. The variable resistor pattern direct contacts sidewalls of the conductive patterns at active contact areas. A metal interconnection is formed to be electrically connected to the other conductive pattern.

The pair of conductive patterns can be formed by following steps according to some embodiments. The conductive layer is patterned to form a intermediate conductive pattern so as to be electrically connected to the impurity diffusion region. Next, an insulating layer is formed on the resultant structure having the intermediate conductive pattern. Thereafter, the insulating layer and the intermediate conductive pattern are patterned to form the conductive patterns so that the intermediate conductive pattern is apart from the pair of conductive patterns. The insulating layer and the intermediate conductive pattern are patterned to form the variable resistivity resistor material layer over the insulating layer, at a space between the pair of conductive patterns. Thereafter, the variable resistivity material layer is patterned to form the variable resistivity material pattern.

The pair of the conductive pattern can be formed by forming an insulating-layer on the conductive layer and patterning the insulating layer and the conductive layer. The variable resistor material pattern may be formed by patterning the insulating layer and the intermediate conductive pattern, forming the variable resistor material layer over the insulating layer at a space between the pair of conductive patterns, and patterning the variable resistor material layer.

In some embodiments, forming the conductive layer includes forming a lower insulating layer on the semiconductor substrate, patterning the lower insulating layer to form a lower contact hole exposing the impurity diffusion region, filling the contact hole to form a lower contact plug, and forming the conductive layer on the contact plug and the lower insulating layer. In further embodiments, forming the metal interconnection includes forming an upper insulating layer on the resultant structure with the variable resistor material pattern, patterning the upper insulating layer to form an upper contact hole which exposes the other conductive pattern that is not electrically connected to the impurity diffusion region, forming an upper contact plug filling the upper contact hole, forming a metal layer on the upper insulating layer and on the upper contact plug, and patterning the metal layer. In other embodiments, providing the semiconductor substrate includes forming another impurity diffusion region and a gate line to be positioned between the impurity diffusion region and another impurity diffusion region, forming a common drain electrode to be electrically connected to another impurity diffusion region.

In accordance with further embodiments of the present invention, there are provided methods of forming phase-changeable memory devices. A source region, a drain region and a gate electrode are formed on a semiconductor substrate. A common drain electrode is formed to be isolated from the semiconductor substrate by an insulating layer and to be electrically connected to the drain region through a predetermined region of the insulating layer. A lower insulating layer is formed on the resultant structure having the common drain electrode. A lower contact plug is formed in the lower insulating layer to be electrically connected to the source region. A phase-changeable material layer and a protective insulating layer are sequentially formed on the lower insulating layer and the lower contact plug. The protective insulating layer and the phase-changeable material layer are successively patterned to form a protective insulating pattern and a phase-changeable material pattern so as not to be in contact with the lower contact plug. A conductive layer is formed on the lower insulating layer, the lower contact plug and the patterns. Next, the conductive layer is patterned such that an upper portion of the phase-changeable material pattern is partially exposed, to form a pair of conductive patterns. The pair of conductive patterns is spaced apart from each other by the phase-changeable material pattern and in direct contact with both sidewalls of the phase-changeable material pattern. One conductive pattern is electrically connected to the lower contact plug. An upper insulating layer is formed on the lower insulating layer, the conductive patterns and the exposed phase-changeable material pattern. An upper contact plug is then formed to be electrically connected to the other conductive pattern that is not electrically connected to the lower contact plug. A metal interconnection is formed on the upper insulating layer to be electrically connected to the upper contact plug.

In accordance with further embodiments of the present invention, methods of forming phase-changeable memory devices are provided. A source region, a drain region and a gate electrode are formed at a semiconductor substrate. A common drain electrode is formed to be electrically connected to the drain region. A lower insulating layer is formed on the resultant structure having the common drain electrode. A lower contact plug is then formed in the lower insulating layer to be electrically connected to the source region. A conductive layer is formed on the lower insulating layer and the lower contact plug. The conductive layer is patterned to form a pair of conductive patterns, which are apart from each other, such that one conductive pattern is in contact with the lower contact plug. A chalcogenide material pattern is formed between the pair of conductive patterns so as to be directly contact with sidewalls of the pair of conductive patterns. An upper insulating layer is formed on the resultant structure having the material patterns. An upper contact plug is formed to be electrically connected to the other conductive pattern that is not electrically connected to the lower contact plug. A metal interconnection is formed on the upper insulating layer to be electrically connected to the upper contact plug.

The pair of conductive patterns may be formed by the following steps: The conductive layer is patterned to form an intermediate conductive pattern that is electrically connected to the lower contact plug. Next, an insulating layer is formed on the resultant structure where the intermediate conductive pattern will be formed. Thereafter, the insulating layer and the intermediate conductive pattern are patterned to the pair of conductive patterns. The chalcogenide material pattern may be formed by forming a chacogenide layer on the insulating layer and exposed lower insulating layer between the pair of conductive patterns, and patterning the chacogenide layer.

DETAILED DESCRIPTION

Figure 1:
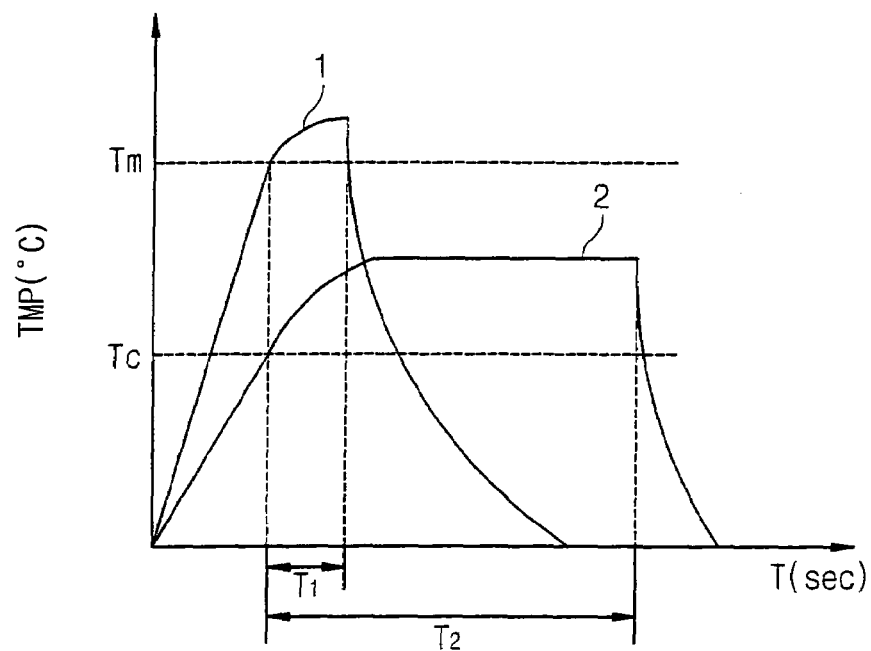
FIG. 1 is a graph illustrating operations for programming and erasing a phase-changeable memory cell.
Figure 2:
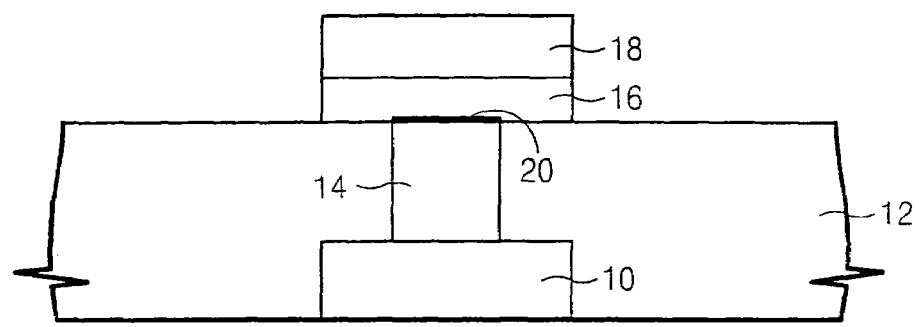
FIG. 2 is a cross-sectional view showing a portion of a typical conventional phase-changeable memory device.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

A phase-changeable memory device according to some embodiments of the present invention includes a phase-changeable material region with two active contact areas that are disposed on the same plane. That is, the active contact areas exist at opposing sidewalls of a phase-changeable material region. On the same plane as the phase-changeable material layer, conductive patterns are in contact with the phase-changeable material region at the active contact areas. The conductive patterns serve as a current path that supplies predetermined currents to the sidewalls of the phase-changeable material region. The phase-changeable material region is interposed between the symmetrical pair of conductive patterns on the same plane. Accordingly, currents in the phase-changeable material region flow in a lateral (horizontal) direction.

Figure 3A:
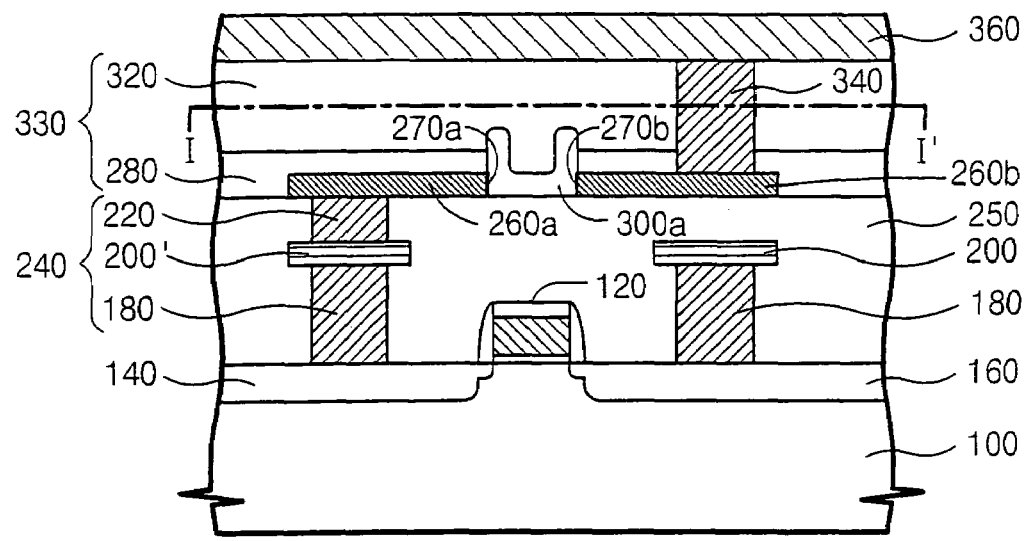
FIG. 3A is a cross-sectional view showing a portion of a phase-changeable memory device according to first embodiments of the present invention.
Figure 3B:
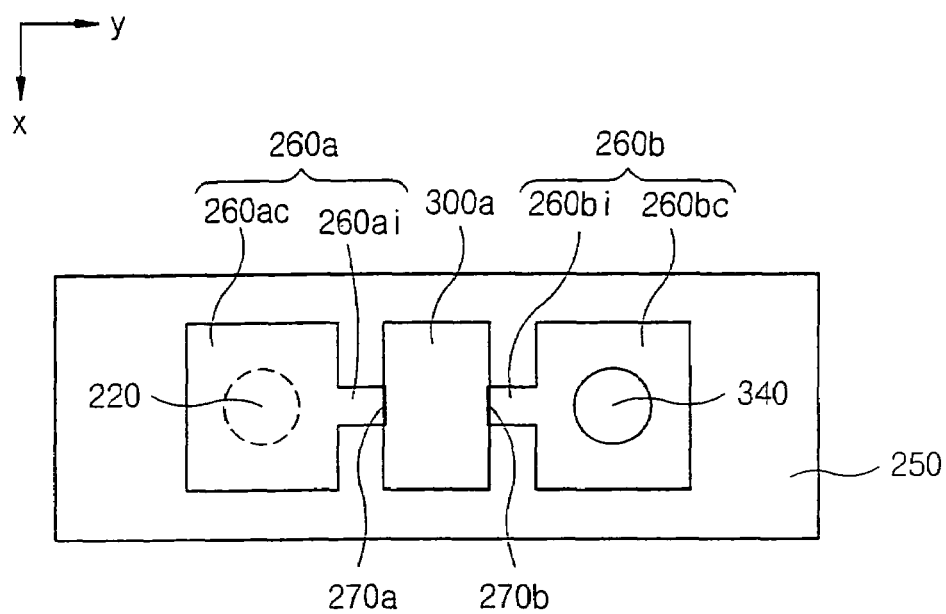
FIG. 3B is a top plan view of the phase-changeable memory device of FIG. 3A, taken along a line I–I'.
Figure 3C:
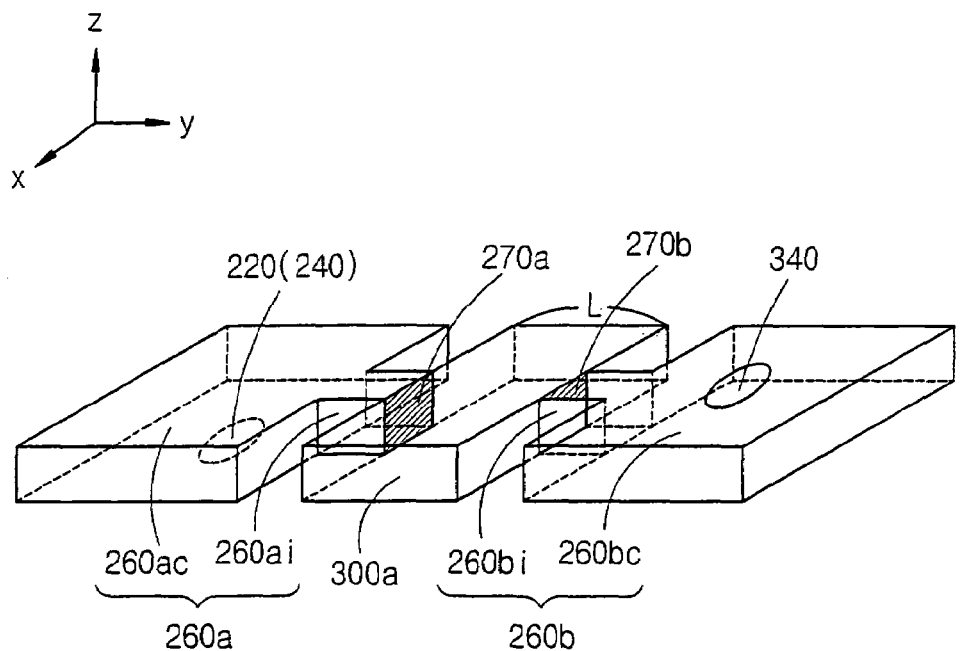
FIG. 3C is a perspective view of the phase-changeable memory device of FIGS. 3A and 3B.

FIG. 3A is a cross-sectional view of a phase-changeable memory device according to some embodiments of the present invention. FIG. 3B is a top plan view of the phase-changeable memory device of FIG. 3A, taken along a line I–I'. FIG. 3C is a perspective view of the phase-changeable memory device of FIGS. 3A and 3B.

Referring to FIGS. 3A through 3C, the phase-changeable memory device includes a pair of conductive patterns 260a and 260b and a phase-changeable material pattern 300a. The pair of conductive patterns 260a and 260b are disposed on opposite sides of the phase-changeable material pattern 300a on the same plane, i.e., on a lower insulating layer 250. The pair of conductive patterns 260a and 260b are spaced apart from each other by a predetermined length L. The phase-changeable material pattern 300a is interposed between the conductive patterns 260a and 260b, and is in direct contact with sidewalls of the conductive patterns 260a and 260b. One conductive pattern (here, the conductive pattern 260a) is electrically connected to a first source/drain region, e.g., an impurity diffusion region 140, of a semiconductor substrate 100. The other conductive pattern 260b is electrically connected to a metal interconnection 360 (e.g., a bit line). Preferably, the conductive pattern 260a is electrically connected to the impurity diffusion region 140 through a contact plug 240 passing through the lower insulating layer 250. The other conductive pattern 260b is electrically connected to the metal interconnection 360 through a contact plug 340 passing through an upper insulating layer 330 that is interposed between the conductive pattern 260b and the metal interconnection 360. The upper insulating layer 330 is interposed between the metal interconnection 360 and the conductive pattern 260a and the phase-changeable material pattern 300a. In the semiconductor substrate 100, another source/drain region, e.g., another impurity diffusion region 160, is spaced apart from the impurity diffusion region 140 that is electrically connected to one conductive pattern 260a. A gate electrode 120 is disposed on the semiconductor substrate 100 between the impurity diffusion regions 140 and 160. The impurity diffusion regions 140 and 160 and the gate electrode 120 form an access transistor Ta. The gate electrode 120 acts as a word line. A common drain electrode 200 is disposed in the lower insulating layer 250 so as to be electrically connected to the other impurity diffusion region 160 through a contact plug formed in the lower insulating layer 250. The conductive patterns 260a and 260b are electrically isolated from the gate electrode 120 and the common drain electrode 200 by the upper insulating layer 250.

The conductive pattern 260a includes a plug contact region, e.g., a relatively large body portion 260ac, and a material pattern contact region, e.g., a relatively small tab portion 260ai extending from the body portion. The plug contact region 260ac is in contact with the contact plug 240. The material pattern contact region 260ai is in contact with the phase-changeable material pattern 300a. The conductive pattern 260b also includes a similar plug contact region 260bc and a similar material pattern contact region 260bi. The plug contact region 260bc is in contact with the contact plug 340. The material pattern contact region 260bi is in contact with the phase-changeable material pattern 300a. The material pattern contact regions 260ai and 260bi are extended from a middle portion of sidewalls of the plug contact regions 260ac and 260bc toward the phase-changeable material pattern 300a. It is preferable that the width of the material pattern contact regions 260ai and 260bi are made as narrow as possible to the resolution of the photolithography. Because the plug contact regions 260ac and 260bc are connected to the contact plugs 240 and 340, the plug contact regions 260ac and 260bc are relatively larger than the material pattern contact regions 260ai and 260bi.

The length L between the pair of conductive patterns (i.e., a size of Y axis dimension of the phase-changeable material pattern 300a) depends on the photolithography resolution. The conductive patterns 260a and 260b are in contact with the phase-changeable material pattern 300a at active contact areas 270a and 270b at opposite sidewalls of the phase-changeable material pattern 300a. It is preferable that the active contact areas 270a and 270b be made as small as possible in order to reduce currents required to vary a crystallization state of phase-changeable material pattern 300a.

According to some embodiments of the present invention, the dimensions of the active contact areas 270a and 270b is dependent upon a thickness T (i.e., a Z axis dimension) of the conductive patterns 260a and 260b and a width W of the conductive patterns 260a and 260b (i.e., the material pattern contact regions 260ai and 260bi). The width W of the conductive patterns 260a and 260b may be limited to the photolithography resolution. Because the thickness T of the conductive patterns generally is not limited by the photolithography resolution, the thickness T can be lower than the photolithography resolution. Furthermore, the phase-changeable memory device includes two active contact areas 270a and 270b. Therefore, although the same currents (i.e., joule heat) are used, a resistivity variation can be doubled.

Figure 4:
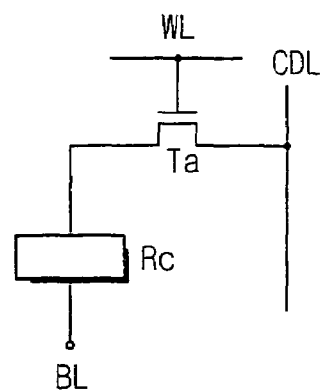
FIG. 4 is an equivalent circuit view of the phase-changeable memory device of FIGS. 3A–3C.

Program and read operations of the phase-changeable memory device will now be described. FIG. 4 is an equivalent circuit of the phase-changeable memory device of FIGS. 3A–3C. Referring to FIGS. 3A–3C and 4, the bit line BL (i.e., the metal interconnection 360) is grounded and a turn on voltage is applied to the word line WL (i.e., the gate electrode 120). Predetermined current flows are applied to the common drain electrode CDL (200 in FIGS. 3A–3C). Accordingly, a current path is formed between the common drain electrode CDL and the bit line BL. The crystallization state of the active contact areas 270A and 270B of the phase-changeable material pattern Rc is changed by Joule heat (Joule energy) of the current flow. The amount of current applied to the common drain electrode CDL is adjusted, so that heat (energy) applied to the active contact area is determined. Thus, phase-changeable materials have a crystalline state or an amorphous state depending on current flow. For example, if a temperature of 650° C. is applied during very short time to the active contact areas, the phase-changeable materials of the active contact areas are transformed into the amorphous state. If a temperature of 400° C. is applied for a relatively long time to the active contact areas, the phase-changeable materials of the active contact areas are transformed into the crystalline state. Alternatively, the program operation can be performed by grounding the common drain electrode CDL, and applying predetermined current flows to the bit line BL.

Next, the read operation will be explained. The common drain electrode CDL is grounded, and a read voltage is applied to the bit line BL. The bit line BL detects resistivity (i.e., currents flowing through the phase-changeable material pattern) of the phase-changeable material pattern Rc. Therefore, a logic value can be discriminated.

Figure 5A:
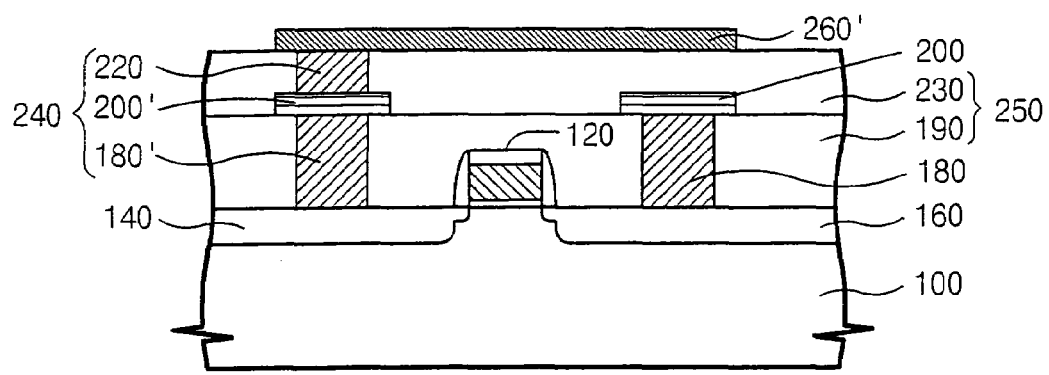
FIGS. 5A–5G are cross-sectional views showing exemplary operations for forming a phase-changeable memory device according to some embodiments of the present invention.
Figure 5B:
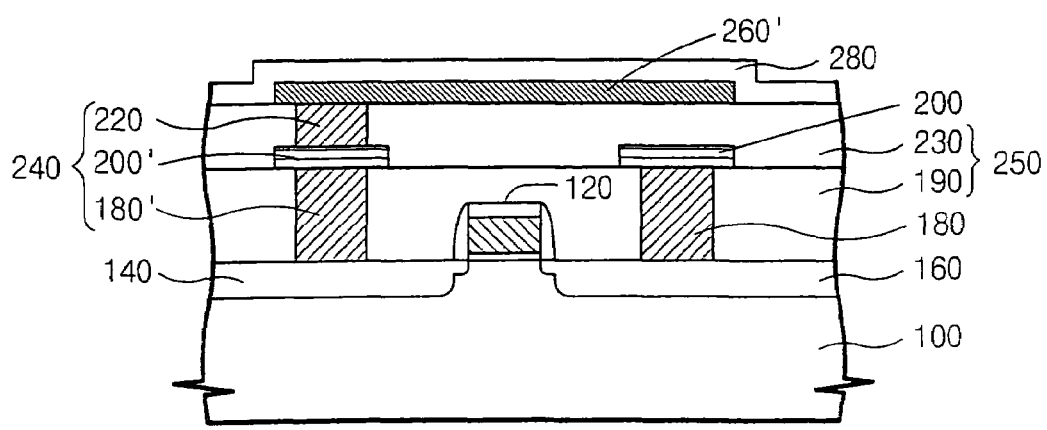
Figure 5C:
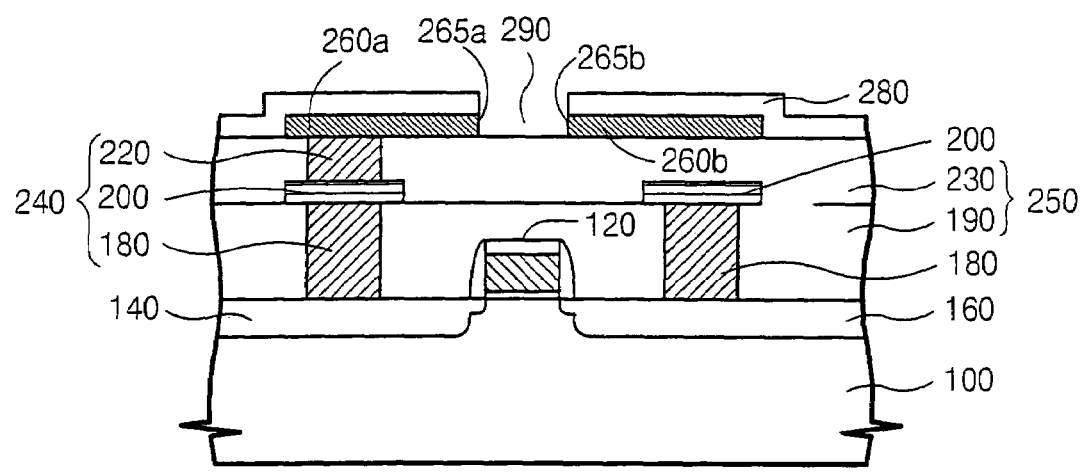
Figure 5D:
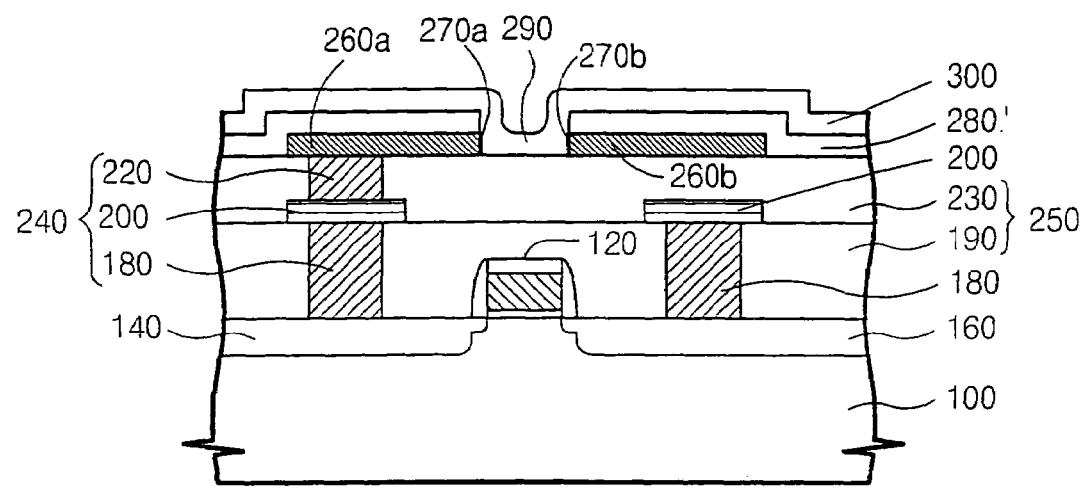
Figure 5E:
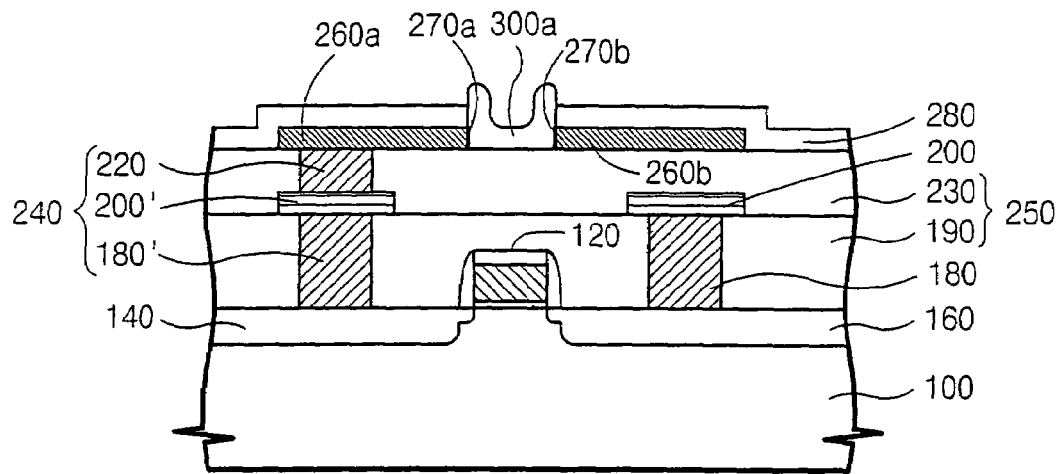
Figure 5F:
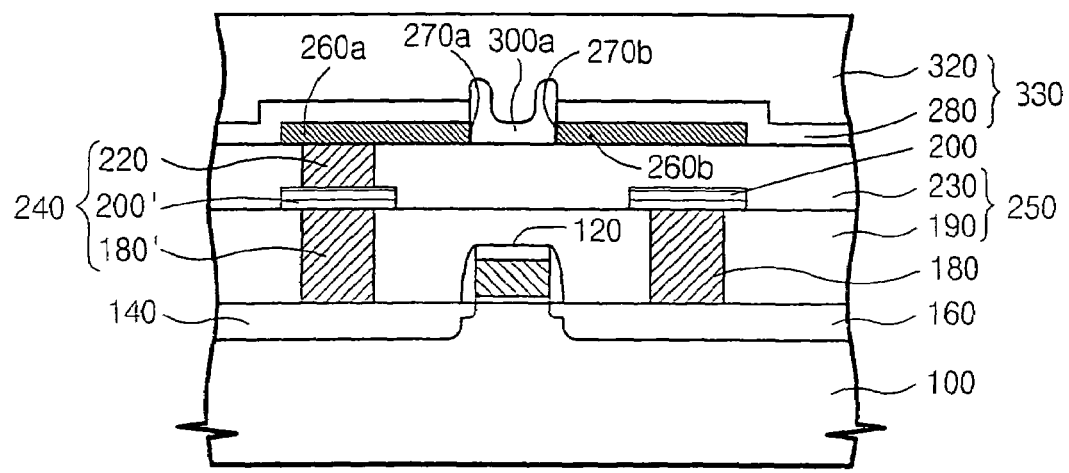
Figure 5G:
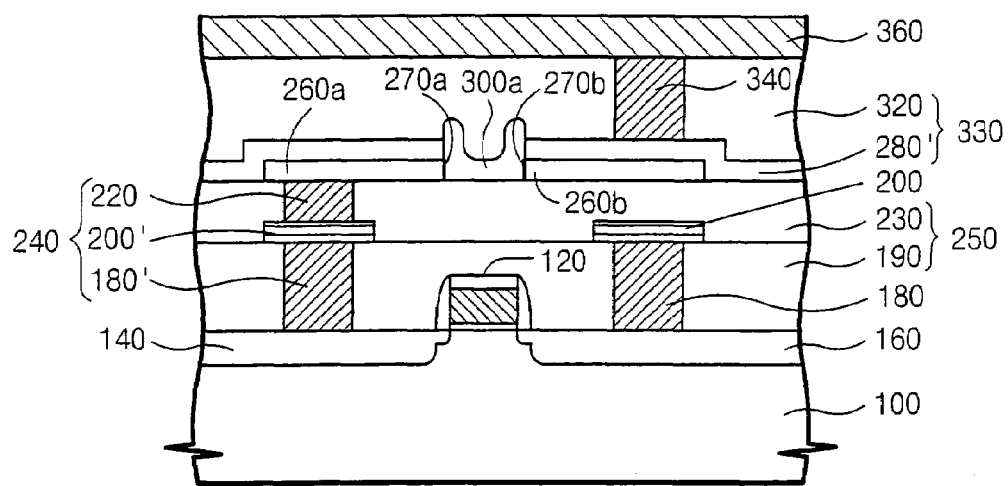

FIGS. 5A through 5G illustrate methods for forming a phase-changeable memory device as shown in FIG. 5G according to first embodiments of the present invention. Referring to FIG. 5A, after a device isolation process is performed by a conventional method, an access transistor is formed on a semiconductor substrate 100. The access transistor includes a source region 140, a drain region 160 and a gate electrode 120. A lower first oxide layer 190 is formed on the semiconductor substrate 100 having the access transistor. A common drain electrode 200 is formed on the lower first oxide layer 190 and is electrically connected to the drain region 160 of the access transistor. A lower second oxide layer 230 is formed on the common drain electrode 200 and the lower first oxide layer 190. The lower first oxide layer 190 and the lower second oxide layer 230 form a lower insulating layer 250. An intermediate conductive pattern 260' is formed on the lower second oxide layer 230 and is electrically connected to the source region 140 of the access transistor.

More particularly, the common drain electrode 200 is electrically connected to the drain region 160 by a contact plug 180. The contact plug 180 penetrates the lower first oxide layer 190 and contacts the drain region 160. A contact plug process includes forming a contact hole by a photolithographic process and depositing a conductive material in the contact hole. Likewise, the intermediate conductive pattern 260' is electrically connected to the source region 140 through contact plug 240 penetrating the lower insulating layer 250. Preferably, the contact plug 240 includes a first contact plug 180', a conductive pad 200', and a second contact plug 220. The first contact plug 180' is in contact with the source region 140 through the lower first oxide layer 190. The conductive pad 200' is formed on the lower first oxide layer 190 and is electrically connected to the first contact plug 180'. The second contact plug 220 is in contact with the conductive pad 200' through the lower second oxide layer 230. In this case, when the common drain electrode 200 is formed, the first contact plug 180' and the conductive pad 200' are formed simultaneously. After depositing the lower second oxide layer 230, a contact hole is formed to expose the contact pad 200', and then conductive material is deposited in the contact hole to form the second contact plug 220. Thereafter, a conductive layer is formed on the second contact plug 220 and the lower second oxide layer 230. The conductive layer is patterned to form the intermediate conductive pattern 260' that is electrically connected to the second contact plug 220.

The second contact plug 220 is made of sequentially stacked Titanium (Ti), titanium nitride (TiN), and tungsten (W) layers. For example, the Ti layer may have a thickness of 50 angstroms, the TiN layer may have a thickness of 250 angstroms and the W layer may have a thickness of 2500 angstroms.

The intermediate conductive pattern 260' is made of TiN with a thickness of 200 angstroms. Preferably, the intermediate conductive pattern 260' is formed as thin as possible, because the thickness of the intermediate conductive pattern 260' is an important factor determining dimensions of an active contact area. Accordingly the thickness of the intermediate conductive pattern 260' can be made to size smaller than the photolithographic resolution.

Referring to FIG. 5B, an upper first oxide layer 280 is formed on the intermediate conductive pattern 260' and the lower insulating layer 250. For example, the upper first oxide layer 280 may have a thickness of about 5000 angstroms.

Referring to FIG. 5C, the upper first oxide layer 280 and the intermediate conductive pattern 260' are etched by a photolithographic etching process. An opening 290 is formed to expose a portion of the lower first oxide layer 230 under a middle portion of the intermediate conductive pattern 260'. Thus, the intermediate conductive pattern 260' is divided into a pair of conductive patterns 260a and 260b, which are spaced apart from each other by the opening 290. Here, one conductive pattern 260a is electrically connected to the second contact plug 220, in particular, a bottom surface of the conductive pattern 260a is in contact with the second contact plug 220. The opening 290 exposes sidewalls 265a and 265b of the conductive patterns 260a and 260b.

Referring to FIG. 5D, a variable resistivity material layer 300 is formed to cover the patterned upper first oxide layer 280', the exposed lower first oxide layer 230 and the exposed sidewalls 265a and 265b of the conductive patterns. The variable resistivity material layer 300 is a material whose crystalline state can be varied depending on temperature. The variable resistivity material layer 300 is made of a phase-changeable material layer, for example, a GST layer. The phase-changeable material layer 300 may have a thickness of about 200 angstroms. The variable resistor material layer 300 is contact with the sidewalls 265a and 265b of the conductive patterns 260a and 260b to define active contact areas 270a and 270b.

Referring to FIG. 5E, for electrical isolation between neighboring cells, the phase-changeable material layer 300 is etched by a photolithographic etching process to form the phase-changeable material pattern 300a (i.e., a phase-changeable memory cell). The phase-changeable material pattern 300a is formed between the conductive patterns 260a and 260b, so that sidewalls thereof are in direct contact with the sidewalls 265a and 265b of the conductive patterns 260a and 260b at active contact areas 270a and 270a.

Referring to FIG. 5F, an upper second oxide layer 320 is formed on the surface of the semiconductor substrate where the phase-changeable material pattern 300a is formed. The upper second oxide layer 320 and the upper first oxide layer 280 form an upper insulating layer 330.

Referring to FIG. 5G, the upper insulating layer 330 is patterned to form a contact hole exposing the conductive pattern 260b that is not in contact with the second contact plug 220. Next, a conductive material is deposited to form a contact plug 340. The contact plug 340 may be formed using the same method used in forming the second contact plug 220. A metal material is deposited on the contact plug 340 and the upper insulating layer 330 to be patterned. Thereafter, a bit line 360 is formed. The bit line 360 is a metal interconnection electrically contacting with the contact plug 340. For example, the bit line 360 may be formed of aluminum.

Figure 6A:
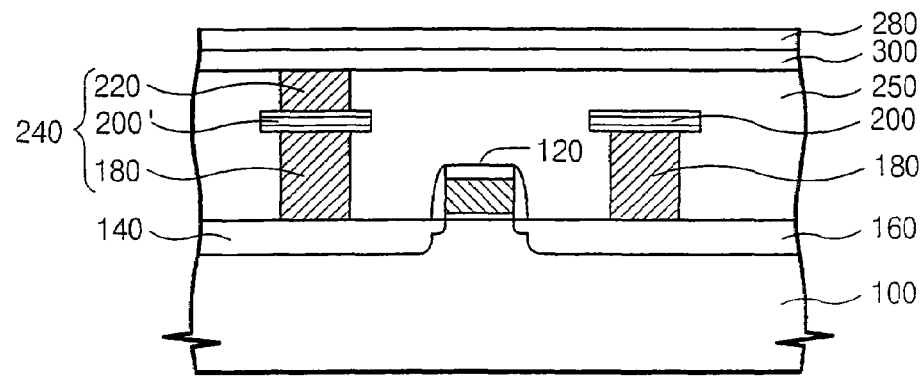
FIGS. 6A–6E are cross-sectional views showing exemplary operations for forming a phase-changeable memory device according to further embodiments of the present invention.
Figure 6B:
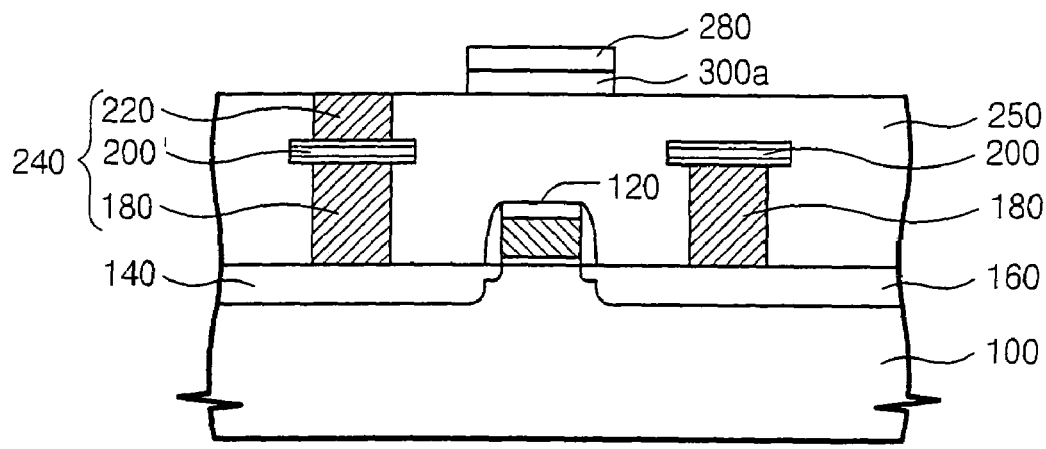
Figure 6C:
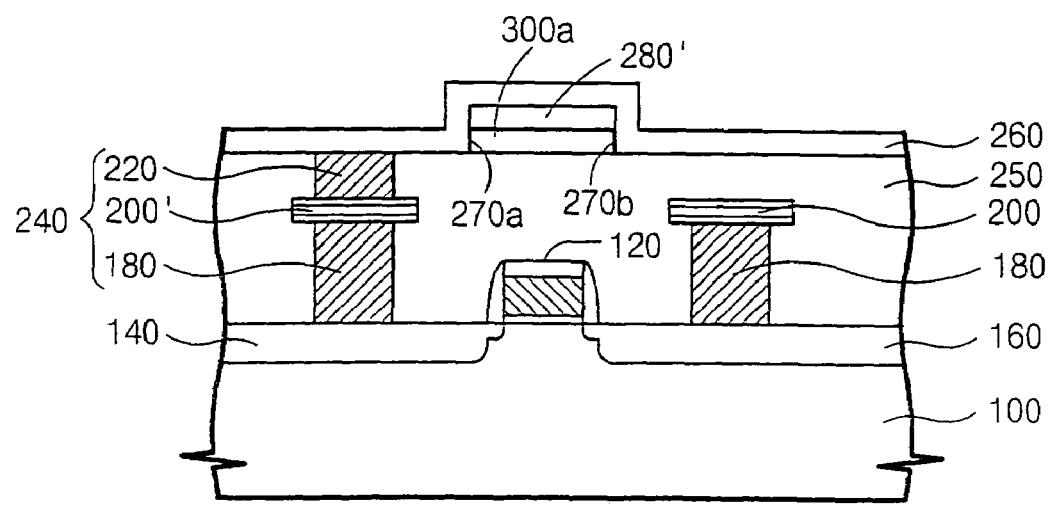
Figure 6D:
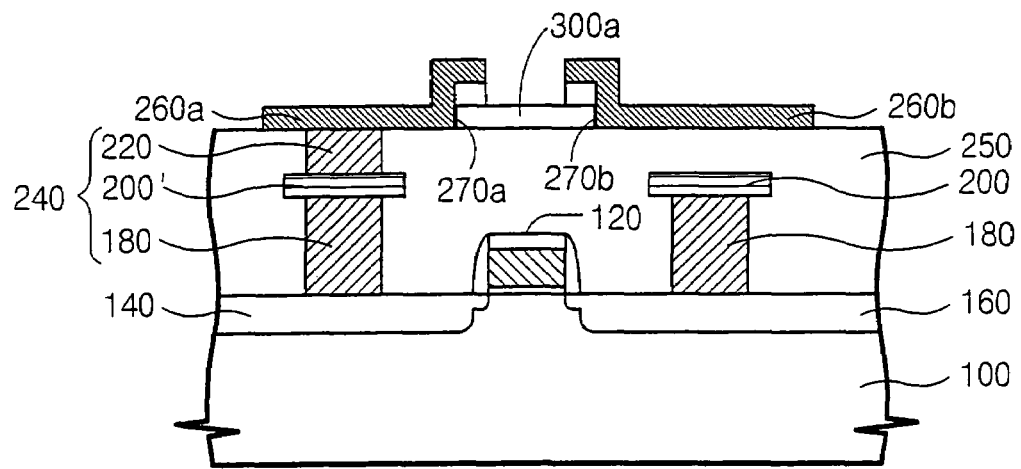
Figure 6E:
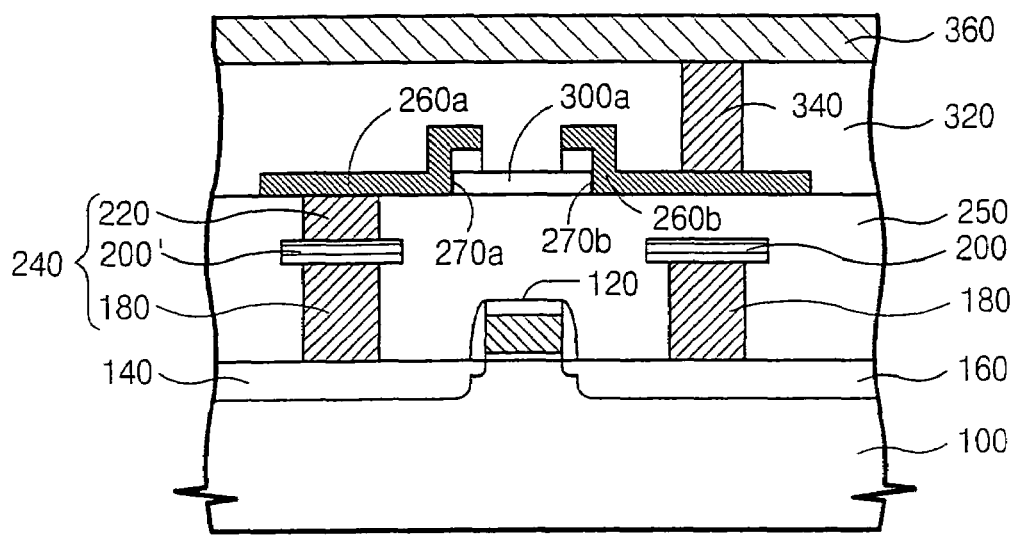

FIGS. 6A–6E show methods of forming the phase-changeable memory device shown in FIG. 6E according to second embodiments of the present invention. In the above-described first embodiments, the phase-changeable material pattern 300a is formed after the conductive patterns 260a and 260b are formed. However, in the second embodiments, the phase-changeable material pattern 300a is formed before the conductive patterns 260a and 260b are formed.

Referring to FIG. 6A, the access transistor, the common drain electrode 200, and the contact plug 240 are formed by the same method as the first embodiments. Next, the phase-changeable material layer 300 is formed on the lower insulating layer 250 and the second contact plug 220. The upper first oxide layer 280 is formed on the phase-changeable material layer 300.

Referring to FIG. 6B, the upper first oxide layer 280 and the phase-changeable material layer 300 are successively patterned to form the phase-changeable material pattern 300a (i.e., a phase-changeable memory cell). The phase-changeable material pattern 300A is spaced apart from the second contact plug 220.

Referring to FIG. 6C, a conductive layer 260 is formed on the surface of the semiconductor substrate having the phase-changeable material pattern 300a, i.e., on the second contact plug 220, the lower oxide layer 250, the patterned upper first oxide layer 280', and both sidewalls of the phase-changeable material pattern 300a. The conductive layer is in contact with the phase-changeable material pattern 300a to define the active contact areas 270a and 270b.

Referring to FIG. 6D, the conductive layer 260 is patterned to form a symmetrical pair of conductive patterns 260a and 260b. At this time, one conductive pattern 260a is electrically connected to the second contact plug 220. That is, a bottom surface of the conductive pattern 260a is in contact with the second contact plug 220.

Referring to FIG. 6E, in a manner similar to that for the first embodiments, the upper second oxide layer 320 is formed. Thereafter, the bit line 360 is formed to be electrically connected to the conductive pattern 260b through the contact plug 340.

Figure 7A:
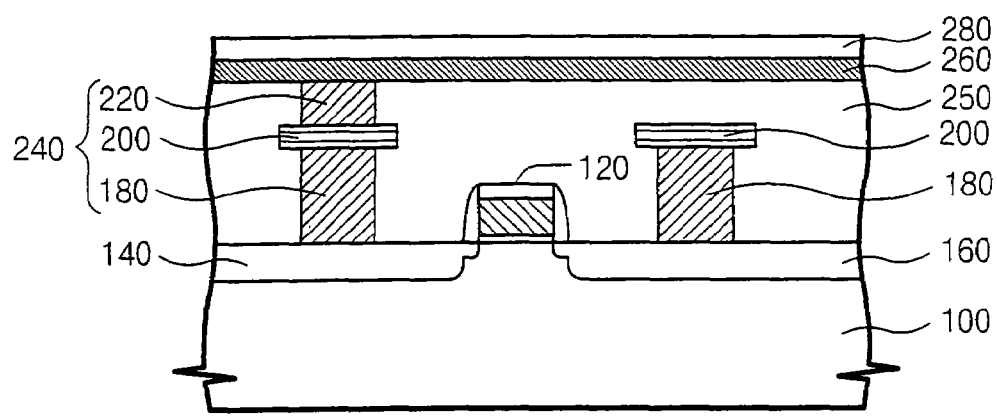
FIGS. 7A–7E are cross-sectional views showing exemplary operations for forming a phase-changeable memory device according to still further embodiments of the present invention.
Figure 7B:
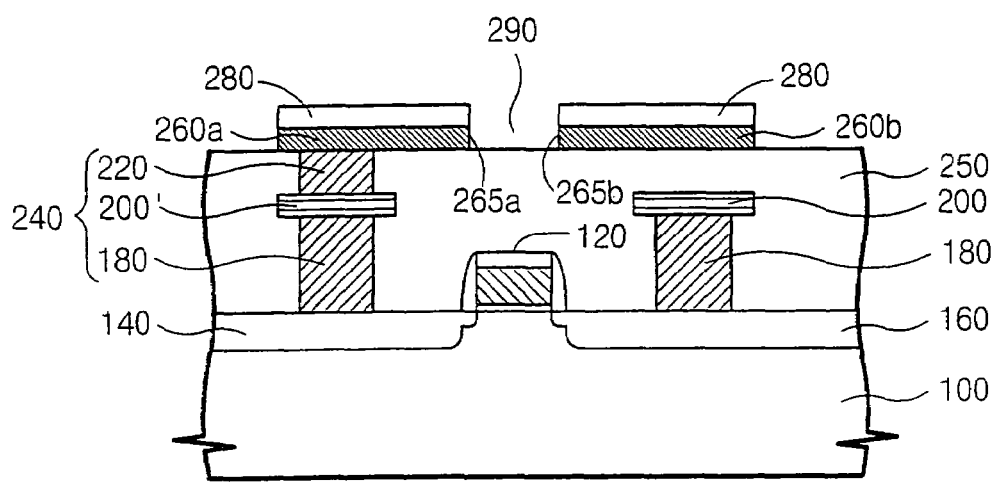
Figure 7C:
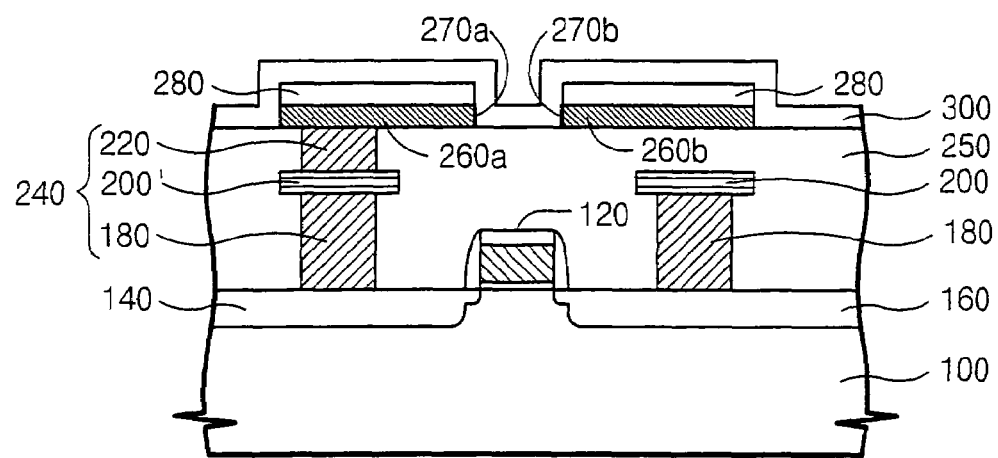
Figure 7D:
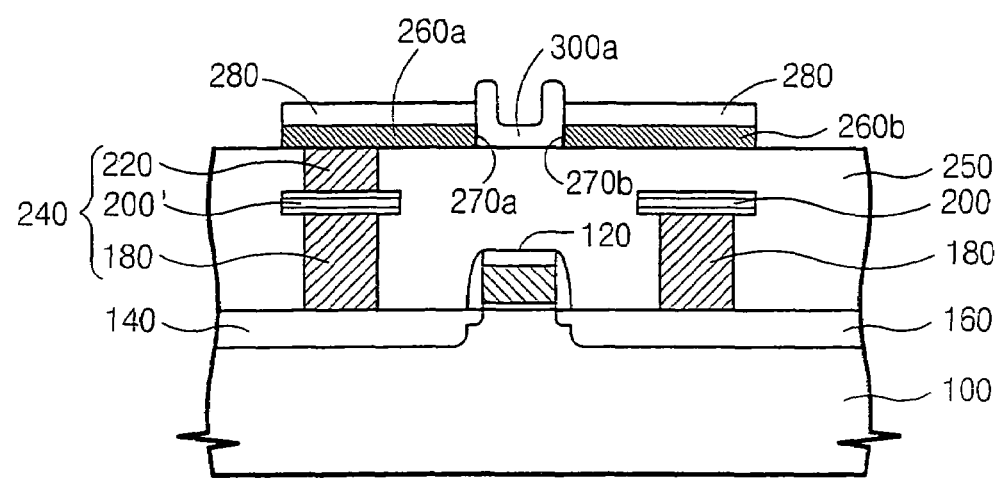
Figure 7E:
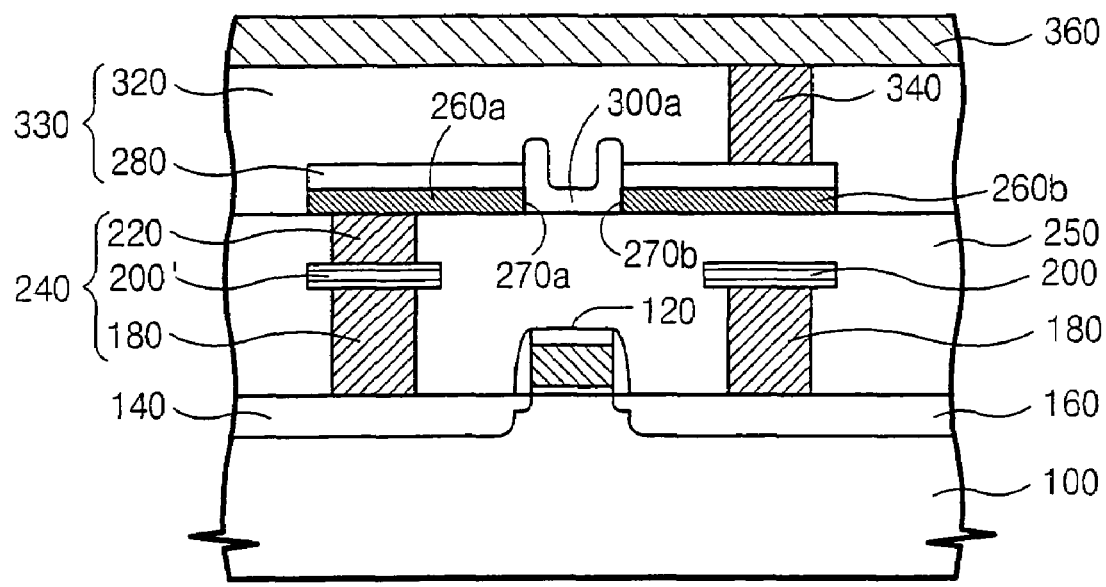

FIGS. 7A through 7E show methods of forming the phase-changeable memory device as shown in FIG. 7E according to third embodiments of the present invention. In the above-described first embodiments, the conductive patterns 260a and 260b are formed after the intermediate conductive pattern 260' is formed. In the third embodiments, the intermediate conductive pattern is not formed.

Referring to FIG. 7A, after the access transistor, the common drain electrode 200, and the second contact plug 220 are formed by the same method as the first embodiments, the conductive layer 260 is formed on the lower second oxide layer 250 and the second contact plug 220. The upper first oxide layer 280 is formed on the conductive layer 260.

Referring to FIG. 7B, the upper first oxide layer 280 and the conductive layer 260 are patterned to form the spaced apart pair of conductive patterns 260a and 260b. The conductive pattern 260a is electrically connected to the second contact plug 220. The conductive patterns 260a and 260b are spaced apart from each other by the opening 290, and the sidewalls 265a and 265b thereof are exposed.

Referring to FIG. 7C, the phase-changeable material layer 300 is formed on the surface of the semiconductor substrate having the conductive patterns 260a and 260b. At this time, the phase-changeable material layer 300 is in contact with the sidewalls 265a and 265b of the conductive patterns 260a and 260b, thus defining the active contact areas 270a and 270b.

Referring to FIG. 7D, the phase-changeable material layer 300 is patterned to be interposed between the pair of conductive patterns 260a and 260b. The phase-changeable material pattern 300a is formed to be in direct contact with the sidewalls 265a and 265b of the conductive patterns 260a and 260b.

Referring to FIG. 7E, by using the same method as the first embodiments, the upper second oxide layer 320 is formed and the bit line 360 is formed. The bit line 360 is electrically connected to the conductive pattern 260b through the contact plug 340.

According to some embodiments of the present invention, dimensions of active contact areas for phase-changeable memory materials may be reduced to decrease currents required during a program operation of a phase-changeable memory device. Also, two active contact areas may be provided, so that a resistivity variation with respect to the same currents may be doubled as compared with a typical phase-changeable memory device. Accordingly, a detection margin for read operations may increase and mis-operation may be reduced.

Furthermore, because the upper and lower electrodes (i.e., conductive patterns) exist on the same plane, a height of a memory cell region can be decreased. Therefore, it is possible to reduce a step difference between the cell region and a peripheral circuit region.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A method of forming a phase-changeable memory device, comprising:
    forming an access transistor in and/or on a substrate;
    forming first and second conductive patterns laterally spaced apart on the substrate and having opposing sidewalls;
    forming a conductor electrically connecting the first conductive pattern to a source/drain region of the access transistor; and
    forming a phase-changeable material region between the first and second conductive patterns and contacting the opposing sidewalls of the first and second conductive patterns.

2. A method according to claim 1, wherein forming an access transistor comprises:
    forming a gate electrode on the substrate; and
    forming first and second source/drain region outside of the gate electrode;
    wherein forming first and second conductive patterns is preceded by:
        forming an insulating layer on the first and second source/drain regions and the gate electrode; and
        forming the conductor to extend from the first source/drain region through the insulating layer;
    wherein forming first and second conductive patterns comprises forming the first and second conductive patterns on the insulating layer overlying respective ones of the first and second source/drain regions such that the first conductive pattern contacts the conductor extending through the insulating layer; and
    wherein forming a phase-changeable material region comprises forming the phase-changeable material region on the insulating layer between the first and second conductive patterns.

3. A method according to claim 2, wherein the conductor contacts the first conductive pattern at a first contact area, and wherein the phase-changeable material region contacts the first conductive pattern at a second contact area that is smaller than the first contact area.

4. A method according to claim 2, wherein the first conductive pattern has a body portion that contacts the first conductive area and a smaller tab portion that extends from the body portion and contacts the phase-changeable material region.

5. A method according to claim 2
    wherein forming first and second conductive patterns comprises:
        depositing a conductive layer on the insulating layer; and
        patterning the conductive layer to form the first and second conductive patterns and to expose a portion of the insulating layer therebetween;

wherein forming a phase-changeable material region is preceded by forming masking regions on the first and second conductive patterns; and wherein forming a phase-changeable material region comprises:

forming a phase-changeable material layer covering the masking regions and contacting the exposed portion of the insulating layer and sidewalls of the first and second conductive patterns; and removing portions of the phase-changeable material layer to leave the phase-changeable material region disposed on the exposed portion of the insulating layer and contacting the sidewalls of the first and second conductive patterns.

6. A method according to claim 5, wherein patterning the conductive layer comprises:

removing portions of the conductive layer to leave a conductive pattern extending over the first and second source/drain regions and the gate electrode;

forming a masking layer on the conductive pattern; and removing portions of the masking layer and the conductive pattern overlying the gate electrode to form the first and second conductive patterns and to expose the portion of the insulating layer therebetween.

7. A method according to claim 5, wherein patterning the conductive layer comprises:

forming a masking layer on the conductive layer; and removing portions of the masking layer and the conductive layer to leave the first and second conductive patterns and respective first and second masking regions on the first and second conductive patterns and to expose a the portion of the insulating layer therebetween.

8. A method according to claim 2 wherein forming a phase-changeable material region comprises:

forming a phase-changeable material layer on the insulating layer;

forming a masking layer on the phase-changeable material layer; and patterning the phase-changeable material layer and the masking layer to form the phase-changeable material region and a masking region on the phase-changeable material region;

wherein forming the first and second conductive patterns comprises:

forming a conductive layer covering the masking layer and adjacent portions of the insulating layer and contacting sidewalls of the phase-changeable material layer; and removing portions of the conductive layer and the masking layer to form the first and second conductive patterns and to expose a portion of the phase-changeable material region between the first and second conductive patterns.

9. A method according to claim 2, wherein the conductor comprises a first conductor, wherein the insulating layer comprises a first insulating layer, and further comprising:

forming a second insulating layer on the first and second conductive patterns;

forming a second conductor extending from the second conductive pattern through the second insulating layer.

10. A method according to claim 9, wherein the second conductor contacts the second conductive pattern at a first contact area, and wherein the phase-changeable material region contacts the second conductive pattern at a second contact area that is smaller than the first contact area.

11. A method according to claim 9, wherein the second conductive pattern comprises a body portion that contacts the second conductor and a smaller tab portion extending from the body portion to contact the phase-changeable material region.

12. A method according to claim 9, further comprising forming a bit line on the second insulating layer and contacting the second conductor.

13. A method according to claim 2 wherein forming an insulating layer comprises forming a first insulating layer on the first and second source/drain regions and the gate electrode;

wherein forming a conductor comprises:

forming a first conductive plug contacting the first source/drain region and passing through the first insulating layer; and forming a conductive pad on the first insulating layer and contacting the first conductive plug;

wherein forming an insulating layer further comprises forming a second insulating layer on the first insulating layer;

wherein forming a conductor further comprises forming a second conductive plug contacting the conductive pad and extending through the second conductive layer; and wherein forming first and second conductive patterns comprises forming the first and second conductive patterns on the second insulating layer.

14. A method according to claim 13, further comprising:

forming a third conductive plug contacting the second source/drain region and passing through the first insulating layer; and forming a common drain line contact pad on the first insulating layer and contacting the third conductive plug.

15. A method of forming a memory device comprising:

providing a semiconductor substrate having an impurity diffusion region;

forming a conductive layer that is electrically connected to the impurity diffusion region;

patterning the conductive layer to form a symmetrical pair of conductive patterns so that one conductive pattern is electrically connected to the impurity diffusion region;

forming a variable resistor pattern between the pair of conductive patterns, wherein the variable resistor pattern includes active contact areas that is in direct contact with opposite sidewalls of the conductive patterns; and forming a metal interconnection that is electrically connected to the other conductive pattern.

16. A method of forming a phase-changeable memory device comprising:

forming a source region, a drain region, and a gate electrode on a semiconductor substrate;

forming a common drain electrode to be isolated from the semiconductor substrate by an insulating layer and to be electrically connected to the drain region through a predetermined region of the insulating layer;

forming a lower insulating layer on the resultant structure where the common drain electrode is formed;

forming a lower contact plug in the lower insulating layer to be electrically connected to the source region;

sequentially forming a phase-changeable material layer and a protective insulating layer on the lower insulating layer and the lower contact plug;

successively patterning the protective insulating layer and the phase-changeable material layer to form a protective insulating pattern and a phase-changeable material pattern so as not to be in contact with the lower contact plug;

forming a conductive layer on the lower insulating layer, the lower contact plug, and the patterns in order to supply currents to the phase-changeable material pattern;

patterning the conductive layer so that an upper portion of the phase-changeable material pattern is partially exposed, to form a pair of conductive patterns such that one conductive pattern is electrically connected to the lower contact plug, wherein the pair of conductive patterns is apart from each other by the phase-changeable material pattern and is in direct contact with both sidewalls of the phase-changeable material pattern;

forming an upper insulating layer on the lower insulating layer, the conductive patterns and the exposed phase-changeable material pattern;

forming an upper contact plug electrically connected to the other conductive pattern that is not electrically connected to the lower contact plug; and forming a metal interconnection on the upper insulating layer to be electrically connected to the upper contact plug.

17. A method of forming a phase-changeable memory device comprising:

forming a source region, a drain region, and a gate electrode at a semiconductor substrate;

forming a common drain electrode to be electrically isolated from the other regions of the semiconductor substrate excepting the drain region and to be electrically connected to the drain region;

forming a lower insulating layer on the resultant structure where the common drain electrode is formed;

forming a lower contact plug in the lower insulating layer to be electrically connected to the source region;

forming a conductive layer on the lower insulating layer and the lower contact plug;

patterning the conductive layer to form a symmetrical pair of conductive patterns apart from each other so that one conductive pattern is in contact with the lower contact plug;

forming a chalcogenide material pattern between the pair of conductive patterns so as to be in direct contact with opposite sidewalls of the pair of conductive patterns;

forming an upper insulating layer on the resultant structure where the material pattern is formed;

forming an upper contact plug electrically connected to the other conductive pattern that is not electrically connected to the lower contact plug; and forming a metal interconnection on the upper insulating layer to be electrically connected to the upper contact plug.

* * * * *

UNITED STATES PATENT AND TRADEMARK OFFICE
CERTIFICATE OF CORRECTION

PATENT NO. : 7,018,911 B2 Page 1 of 1
APPLICATION NO. : 10/940141
DATED : March 28, 2006
INVENTOR(S) : Se-Ho Lee and Young-Nam Hwang It is certified that error appears in the above-identified patent and that said Letters Patent is hereby corrected as shown below:

Column 14, line 32, change "region" to -- regions --.
Column 15, line 32, delete "a the."

Signed and Sealed this

First Day of August, 2006

JON W. DUDAS
*Director of the United States Patent and Trademark Office*